United States Patent
Cheng et al.

(10) Patent No.: US 8,975,697 B2
(45) Date of Patent: Mar. 10, 2015

(54) INTEGRATED CIRCUIT HAVING MOSFET WITH EMBEDDED STRESSOR AND METHOD TO FABRICATE SAME

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/967,890

(22) Filed: Aug. 15, 2013

(65) Prior Publication Data

US 2014/0346600 A1 Nov. 27, 2014

Related U.S. Application Data

(63) Continuation of application No. 13/900,142, filed on May 22, 2013.

(51) Int. Cl.
*H01L 27/12* (2006.01)
*H01L 29/78* (2006.01)

(52) U.S. Cl.
CPC ........ *H01L 29/7848* (2013.01); *H01L 29/7849* (2013.01)
USPC .......................................... 257/347; 257/349

(58) Field of Classification Search
USPC ...................... 257/18, 19, 288, 300, 324, 347
See application file for complete search history.

(56) References Cited

U.S. PATENT DOCUMENTS

| | | | |
|---|---|---|---|
| 6,563,152 B2 * | 5/2003 | Roberds et al. ............... | 257/288 |
| 7,037,794 B2 * | 5/2006 | Beintner et al. .............. | 438/300 |
| 7,524,740 B1 | 4/2009 | Liu et al. | |
| 7,704,839 B2 | 4/2010 | Ieong et al. | |
| 7,851,325 B1 | 12/2010 | Gaines et al. | |
| 7,868,317 B2 * | 1/2011 | Yu et al. ......................... | 257/18 |
| 7,977,221 B2 | 7/2011 | Ninomiya et al. | |
| 8,274,071 B2 * | 9/2012 | Yu et al. ......................... | 257/18 |
| 8,361,867 B2 | 1/2013 | Clifton | |
| 2005/0082522 A1* | 4/2005 | Huang et al. ................... | 257/19 |
| 2005/0194699 A1* | 9/2005 | Belyansky et al. ........... | 257/900 |
| 2006/0234479 A1 | 10/2006 | Liu et al. | |
| 2006/0255330 A1* | 11/2006 | Chen et al. ..................... | 257/18 |
| 2007/0018236 A1* | 1/2007 | Tsuchiaki ..................... | 257/324 |
| 2008/0128800 A1* | 6/2008 | Song et al. ................... | 257/330 |
| 2012/0049280 A1 | 3/2012 | Clifton et al. | |
| 2012/0313168 A1 | 12/2012 | Cheng et al. | |

FOREIGN PATENT DOCUMENTS

JP      2006269999 A    10/2006

* cited by examiner

*Primary Examiner* — Zandra Smith
*Assistant Examiner* — John M Parker
(74) *Attorney, Agent, or Firm* — Harrington & Smith

(57) ABSTRACT

A structure includes a gate stack or gate stack precursor disposed on a SOI layer disposed upon a BOX that is disposed upon a surface of a crystalline semiconductor substrate. A transistor channel is disposed within the SOI layer. The structure further includes a channel stressor layer disposed at least partially within a recess in the substrate and disposed about the channel, and a layer of crystalline dielectric material disposed between the stressor layer and a surface of the substrate.

13 Claims, 12 Drawing Sheets

INTEGRATED CIRCUIT HAVING MOSFET WITH EMBEDDED STRESSOR AND METHOD TO FABRICATE SAME

CROSS-REFERENCE TO A RELATED PATENT APPLICATION

This patent application is a continuation patent application of copending U.S. patent application Ser. No. 13/900,142, filed May 22, 2013, the disclosure of which is incorporated by reference herein in its entirety.

TECHNICAL FIELD

The exemplary embodiments of this invention relate generally to semiconductor devices such as metal oxide semiconductor field effect transistors (MOSFETS) and fabrication techniques for same and, more specifically, relate to the fabrication of semiconductor transistor devices where a stressor layer or structure is employed in order to enhance charge carrier (electron or hole) mobility. Such semiconductor transistor devices can be used in, for example, random access memory (RAM) and logic circuitry.

BACKGROUND

In silicon on insulator (SOI) technology a thin semiconductor layer is formed over an insulating layer, such as silicon oxide, which in turn is formed over a bulk substrate. This insulating layer is often referred to as a buried oxide (BOX) layer or simply as a BOX. For a single BOX SOI wafer the thin semiconductor layer can be divided into active regions by shallow trench isolation (STI) which intersects the BOX and provides total isolation for active device regions formed in the semiconductor layer. Sources and drains of field effect transistors (FETs) are formed, for example, by ion implantation of N-type and P-type dopant material into the thin semiconductor layer and/or by the formation of raised source/drain (RSD) structures. A channel region between a source/drain (S/D) pair can be created so as to underlie a gate structure using, for example, a fin that is defined in the semiconductor layer when a FinFET device is being fabricated.

A strained semiconductor layer can be used to enhance the performance of integrated circuits. Charge carrier mobility enhancement results from a combination of reduced effective carrier mass and reduced phonon scattering. In an n-channel MOS field effect FET with a silicon channel improved performance can be achieved with induced biaxial tensile stress in a silicon layer along both width and length axes of an active area or with uniaxial tensile stress along the length axes. In a p-channel MOSFET improved performance can be achieved with induced uniaxial tensile stress in the silicon layer along the width axis only (transverse tensile stress). The p-channel MOSFET can also show enhanced performance with induced uniaxial compressive stress in the top silicon layer along the length axis only (longitudinal compressive stress). Compressive stress can be provided selectively in a silicon surface layer, for example, by using selective epitaxial SiGe stressors in the source and drain regions of a p-channel MOSFET to induce a desired compressive stress along the length axis (longitudinal). Similarly, tensile strain can be provided, for example, by using selective epitaxial Si:C stressors in the source and drain regions of an n-channel MOSFET.

SUMMARY

In a first non-limiting aspect thereof the embodiments of this invention provide a method that comprises forming a recess into a crystalline semiconductor substrate, the recess being disposed beneath and surrounding a channel region of a transistor; depositing a layer of crystalline dielectric material onto a surface of the crystalline semiconductor substrate that is exposed within the recess; and depositing stressor material into the recess such that the layer of crystalline dielectric material is disposed between the stressor material and the surface of the crystalline semiconductor substrate.

In another non-limiting aspect thereof the embodiments of this invention provide a structure that comprises a transistor gate stack or gate stack precursor disposed on a semiconductor-on-insulator (SOI) layer that in turn is disposed upon a buried oxide layer disposed upon a surface of a crystalline semiconductor substrate, where a transistor channel is disposed within the SOI layer. The structure further comprises a channel stressor layer disposed at least partially within a recess formed in the crystalline semiconductor substrate and disposed about the channel, and a layer of crystalline dielectric material disposed between the channel stressor layer and a surface of the crystalline semiconductor substrate.

In still another non-limiting aspect thereof the embodiments of this invention provide a method that comprises forming a recess into a crystalline semiconductor substrate, the recess being disposed beneath and surrounding a channel region of a transistor. The method further comprises depositing a layer of crystalline dielectric material onto a surface of the crystalline semiconductor substrate that is exposed within the recess. The layer of crystalline dielectric material is comprised of at least one of a rare earth oxide or a combination of rare earth oxides, a Perovskite or an aluminum oxide or an aluminum oxide compound; and. The method further comprises depositing channel region stressor material into the recess such that the layer of crystalline dielectric material is disposed between the stressor material and the surface of the crystalline semiconductor substrate. The stressor material is deposited so as to at least surround the channel region and is comprised of at least one of silicon, germanium, silicon germanium, carbon doped silicon, a silicon-germanium alloy and a compound semiconductor material.

DETAILED DESCRIPTION

Thin channel (e.g., extremely thin SOI or ETSOI) fully depleted MOSFETs are considered as one of the most promising candidates for scaling in 14 nm geometry technologies and beyond. However, the use of embedded stressors is not straightforward with such structures.

When a thin BOX is used it may be possible to recess the BOX and the substrate in the S/D area and form embedded stressors. In this approach an undoped or oppositely doped epitaxy layer can be used at a bottom portion of the embedded stressor to minimize a penalty related to a short-channel effect and junction capacitance. In this approach the source and drain can be isolated from the substrate with a p-n junction.

One advantage of using thin BOX SOI devices is that there is provided an opportunity to use a back gate and back bias to adjust the voltage threshold (Vt) of the FET. However, the presence of the p-n junction isolation limits a range of voltages that can be applied to the back gate.

Clearly a FET device structure having an embedded stressor that is isolated from the substrate without requiring a voltage-sensitive p-n junction would be desirable.

Non-limiting aspects of the embodiments of this invention use an epitaxial oxide layer to isolate an embedded stressor from the underlying substrate.

It should be noted that while the embodiments of FIGS. 1, 2 and 3 will be described in the context of a gate-first type of processing the embodiments could also be realized using a replacement gate (replacement metal gate or RMG) process, where a sacrificial dummy gate structure or plug is formed and subsequently removed and replaced with a desired gate dielectric and gate conductor/metal.

It should be further realized that while the embodiments of FIGS. 1, 2 and 3 will be described in the context of ETSOI structures at least certain aspects of this invention can be employed as well when using FinFET structures, bulk silicon or silicon-containing substrates.

FIGS. 1A-1J illustrate in enlarged cross-section (not to scale) a first embodiment of this invention to provide an epitaxial dielectric material to isolate a stressor from a substrate.

Figure 1A:
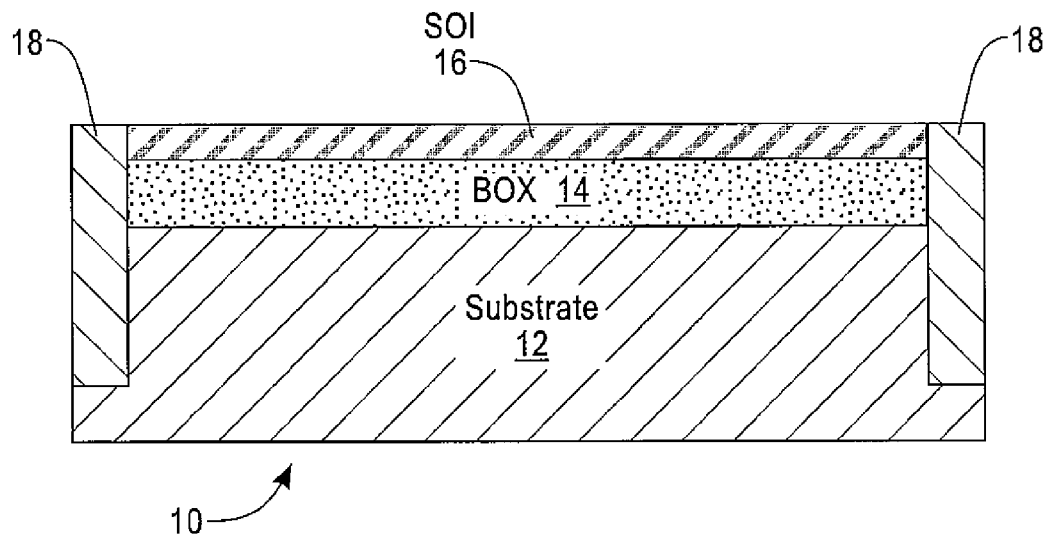
FIGS. 1A-1J, collectively referred to as FIG. 1, illustrate a first embodiment of this invention to provide an epitaxial dielectric material to isolate a stressor from a substrate.

FIG. 1A shows a portion of a semiconductor wafer 10 having a substrate 12, a BOX layer 14 and an overlying semiconductor-on-insulator (SOI) layer 16. What will become a transistor (a MOSFET) active area is delineated by trench isolation structures 18. The substrate 12 can have any desired thickness and can contain silicon or any crystalline semiconductor. The BOX 14 can have a thickness in a range of about 10 nm to about 30 nm, with 20 nm being a suitable value. The BOX 14 may thus be characterized for convenience as being a 'thin' BOX layer. The SOI layer 16 can have a thickness in a range of about 2 nm to about 10 nm and may thus be characterized as being an ETSOI layer. The trench isolation structures 18 can be any suitable dielectric material such as an oxide or a nitride and can extend from the top surface of the SOI 16 into the substrate 12 for about 30 nm or deeper, with 200 nm to about 300 nm being one suitable range of dimensions. In general the depth of the trench isolation 18 is made to be deeper into the substrate 12 than the overall depth of the later fabricated structures (e.g., deeper than ETSOI layer 16 plus thin BOX layer 14 plus a subsequently formed substrate recess 12B shown in FIG. 1E into which an epitaxial dielectric layer 30 and stressor material 32 are grown.) A backgate may be subsequently formed in the substrate 12, such as by implanting a desired dopant species, between the trench isolation structures 18.

It is pointed out that all thicknesses and dimensions and ranges of dimensions stated herein are non-limiting examples of suitable thicknesses and dimensions and ranges of dimensions.

Figure 1B:
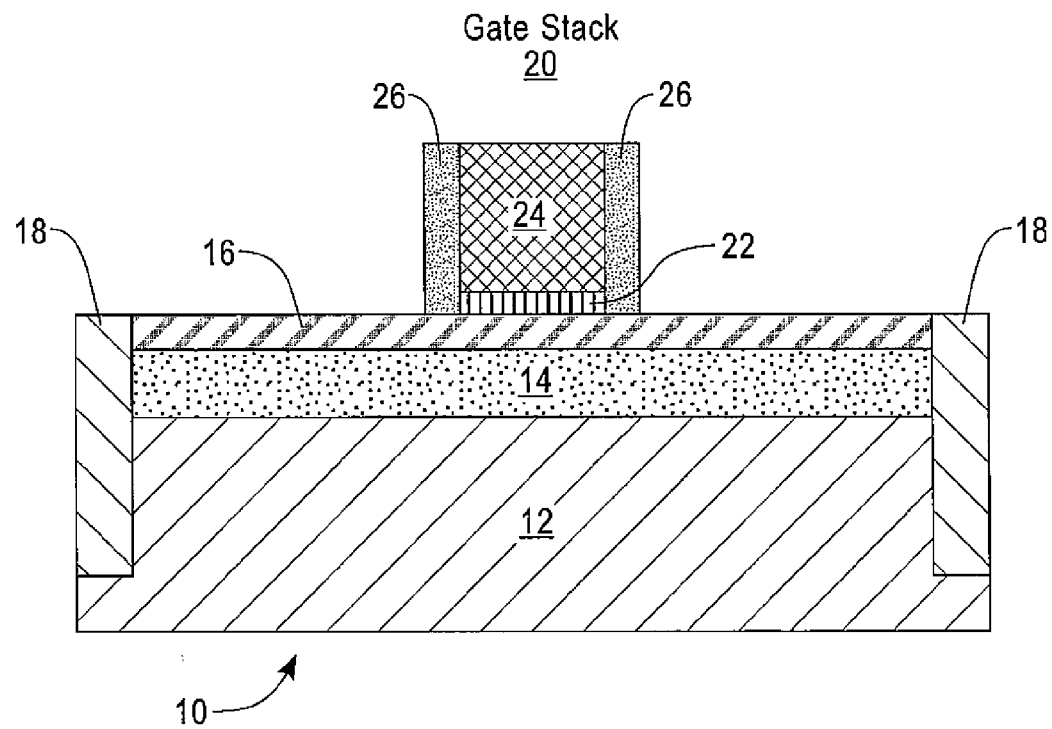

FIG. 1B shows the result of the formation on the SOI 16 of a gate structure also referred to as a stack 20 containing a gate dielectric 22, an overlying gate electrode 24 and dielectric spacers 26. Source/drain (SD) extension regions (not shown) could be formed by implanting and/or diffusing suitable dopant species into the SOI 16 at least partially beneath the gate stack 20. As was noted above the embodiments of this invention could also be used with a RMG process wherein the gate structure would actually at this point be a gate stack precursor structure (e.g., a dummy gate plug).

As a non-limiting example the gate dielectric 22 can be formed as a layer of high dielectric constant (high-k) material comprising a dielectric metal oxide and having a dielectric constant that is greater than the dielectric constant of silicon nitride of 7.5. The high-k dielectric layer 36 be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 36 may be from 1 nm to 10 nm, and more preferably from about 1.5 nm to about 3 nm. The high-k dielectric layer 22 can have an effective oxide thickness (EOT) on the order of, or less than, about 1 nm. The gate metal 24 can be deposited directly on the top surface of the high-k dielectric layer 22 by, for example, chemical vapor deposition (CVD), physical vapor deposition (PVD), or atomic layer deposition (ALD). As non-limiting examples the gate metal 24 can include a metal system selected from one or more of TiN, TiC, TaN, TaC, TaSiN, HfN, W, Al and Ru, and can be selected at least in part based on the desired work function (WF) of the device (NFET or PFET), as is known.

Figure 1C:
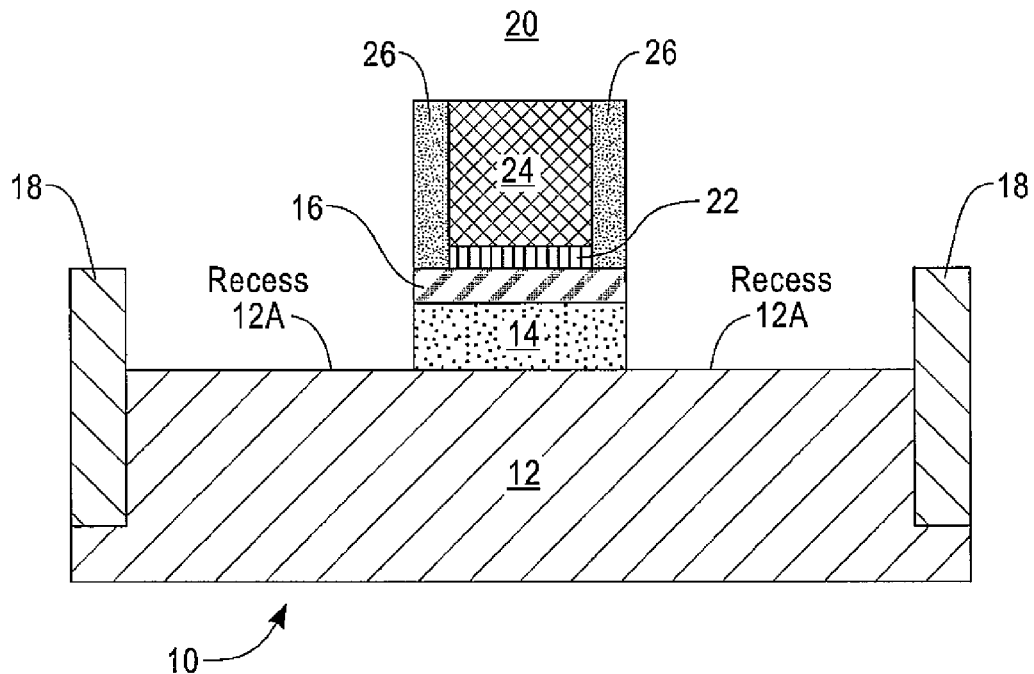

FIG. 1C shows, in accordance with the first embodiment of this invention, a result of recessing the SOI 16 and the BOX 14 in what will be a S/D region between the trench isolation 18. The recessing of the SOI 16 and the BOX 14 can be achieved by using, for example, one or more reactive ion etch (RIE) processes having a chemistry or chemistries selected for removing the SOI 16 and the BOX 14. This process basically exposes the top surface 12A of the substrate 12 over an area that surrounds the gate stack 20 and the underlying portion of the SOI 16 and BOX 14.

Figure 1D:
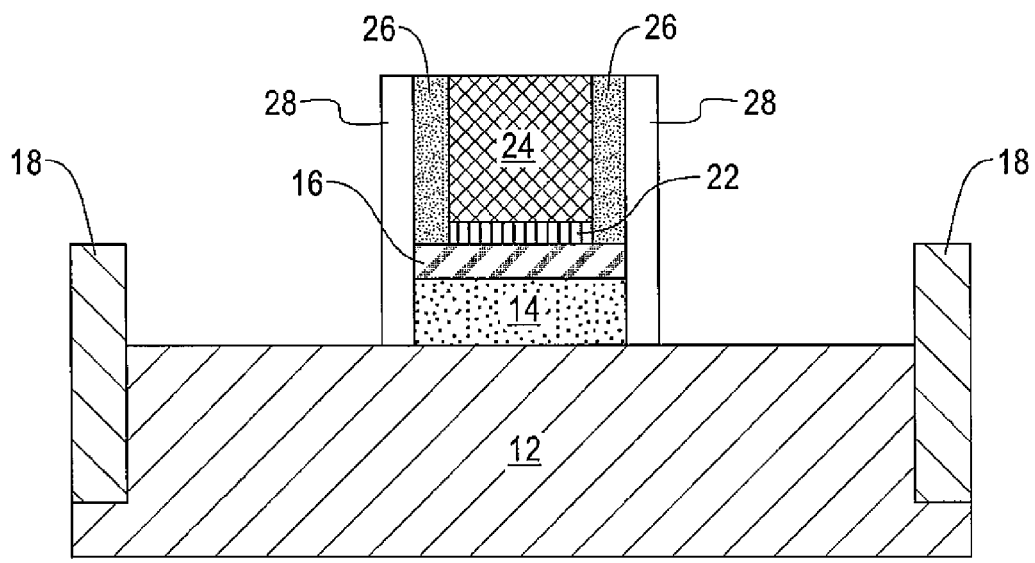

FIG. 1D shows the formation of a spacer 28, e.g., a silicon nitride or a silicon oxide spacer, on sidewalls of the spacer 26, gate dielectric 22, SOI 16 and BOX 14. The spacer 28 is formed to protect during subsequent processing the sidewalls of a channel that will exist in the SOI 16 and can have any desired thickness (e.g., about 3 nm to about 10 or more nm). A portion of the spacer 28 will be subsequently removed as shown in FIG. 1I.

Figure 1E:
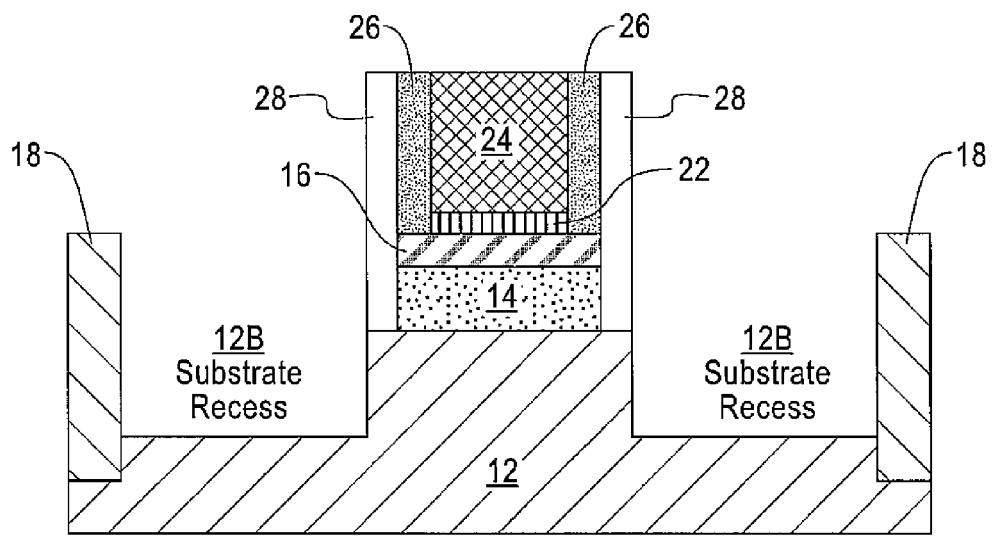

FIG. 1E shows a result of recessing the substrate 12 by RIE or some other suitable process to form substrate recess 12B. The substrate 12 is recessed to a depth that will accommodate a subsequently formed dielectric layer 30 (FIG. 1F) and subsequently deposited embedded stressor material 32 (FIG. 1G).

Figure 1F:
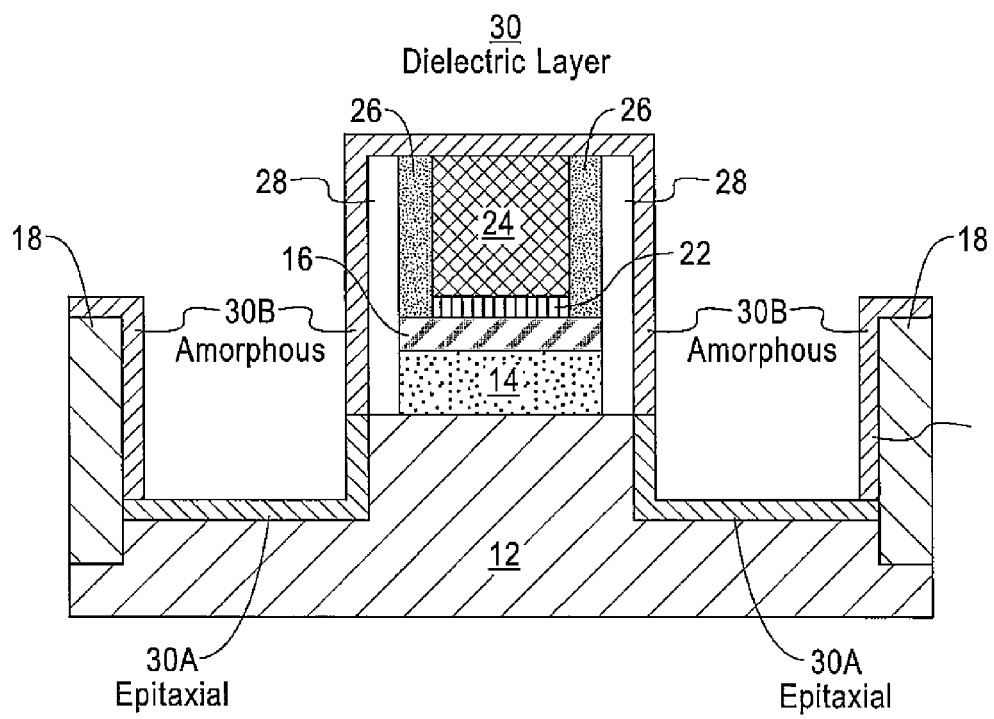

FIG. 1F shows the formation of the dielectric layer 30 by blanket deposition. The dielectric layer 30 can be characterized as being a crystalline (epitaxial) layer 30A where it contacts and overlies the crystalline semiconductor substrate 12, and it can be characterized as being an amorphous layer 30B where it contacts and overlies the amorphous dielectric material of the trench isolation 18 and the spacer 28. The dielectric layer 30 may have a thickness in a range of, for example, about 2 nm to about 10 nm, with a thickness of approximately 5 nm being suitable for many embodiments. In general the characteristic of the dielectric layer 30 (amorphous or crystalline) assumes the characteristic of the material upon which it is deposited. The use of the crystalline dielectric layer 30A is preferred due to the subsequent growth (e.g., see FIG. 1G) of crystalline stressor material 32 upon the crystalline dielectric layer 30A.

In an embodiment, the crystalline dielectric layer 30A may be formed by epitaxial growth on top of an underlying crystalline layer. The crystalline dielectric layer 30A may be formed of an epitaxial oxide grown on the semiconductor substrate 12 and may include a rare earth oxide (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$)). In one embodiment, crystalline dielectric layer 30A may include combinations of rare earth oxides (e.g., a material such as $ABO_3$, where 'A' and 'B' may be any rare earth metal (e.g., lanthanum scandium oxide ($LaScO_3$)). In one embodiment, crystalline dielectric layer 30A may include Perovskites (e.g., strontium titanate ($SrTiO_3$) or barium titanate ($BaTiO_3$)). In yet another embodiment, crystalline dielectric layer 30A may include aluminum oxide $Al_2O_3$ or aluminum oxide compounds (e.g., lanthanum aluminum $LaAlO_3$) which may be deposited by pulsed laser deposition (PLD). It is understood that the description of crystalline dielectric layers herein are for illustrative purposes, and that any number, orientation, configuration, or combination of crystalline dielectric layers may be used in accordance with embodiments of the invention. As was noted above, when the dielectric layer 30 is deposited on an amorphous material such as dielectric material it will exhibit an amorphous, non-crystalline characteristic.

Figure 1G:
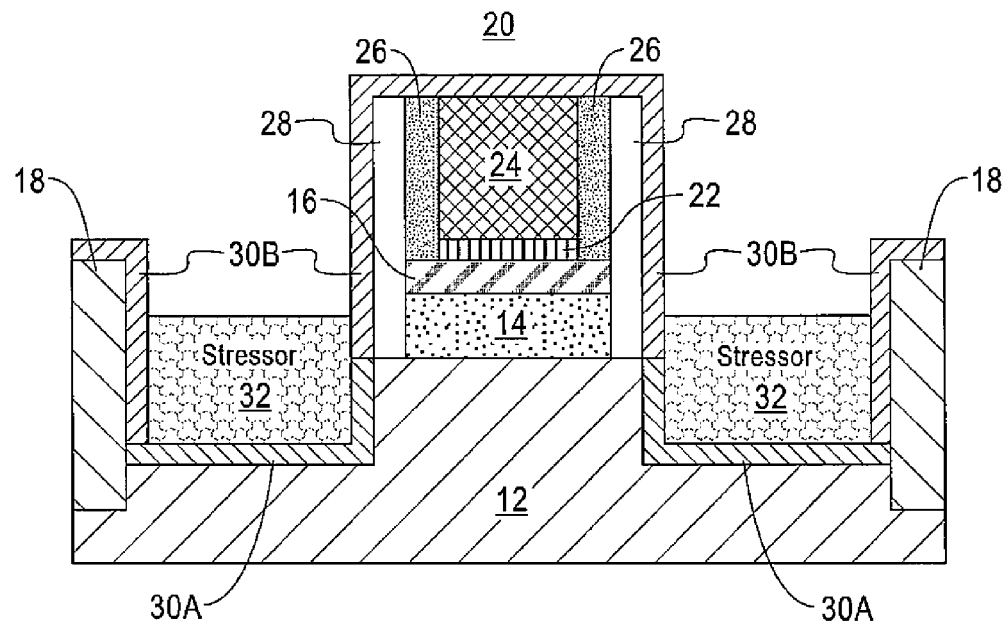

FIG. 1G shows a result of the growth of the embedded stressor 32 within the substrate recess 12B. The embedded stressor 32 functions to apply a desired tensile or compressive stress to the channel of the completed FET device that will exist within the SOI layer 16 beneath the gate stack 20. In an embodiment the stressor 32, when deposited in what will be a pFET region, can be comprised of Si:Ge material at a Ge percentage ratio of 20-80%, with 30-60% being typical. In an embodiment the stressor 32, when deposited in what will be an nFET region can be comprised of Si:C material (carbon-doped silicon).

In general the crystalline semiconductor layer of the stressor 32 may be doped (e.g., in situ doped) or un-doped and may include: silicon, germanium, a silicon-germanium alloy and/or carbon doped silicon (Si:C). In one embodiment, the crystalline semiconductor layer of the stressor 32 may include carbon doped silicon with an atomic carbon concentration of between about 0.2% to about 4.0% substitutional carbon. In one embodiment the crystalline semiconductor layer of the stressor 32 may include a carbon doped silicon type material having a concentration of about 0.3% to about 2.5% substitutional Carbon. It is understood that the total amount of carbon in the crystalline semiconductor layer of the stressor 32 may be higher than the substitutional amount. In an exemplary embodiment the crystalline semiconductor layer of the stressor 32 may include silicon, germanium, silicon germanium, carbon doped silicon, a silicon-germanium alloy, and compound (e.g. III-V and II-VI) semiconductor materials, etc.

The crystalline dielectric layer 30A, in accordance with an aspect of this invention, functions to beneficially electrically and physically isolate the stressor 32 from the substrate 12.

Figure 1H:
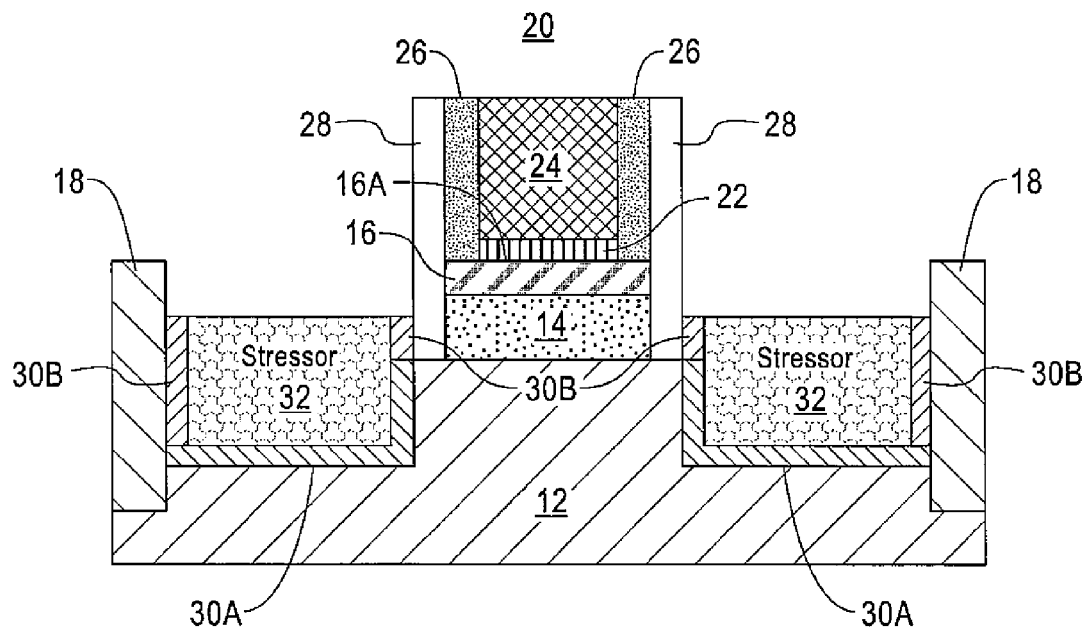
Figure 1I:
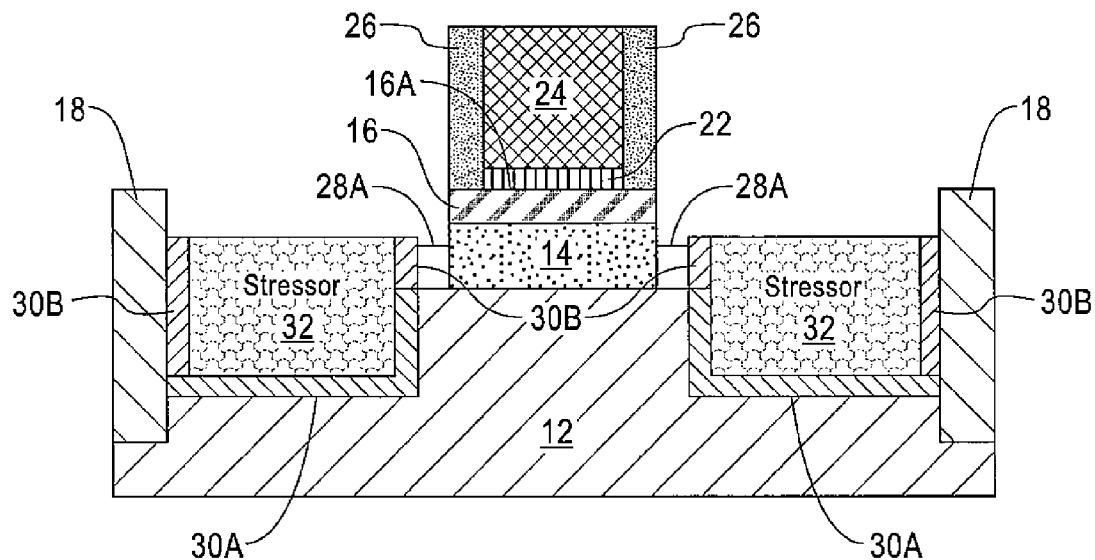

FIG. 1H shows a result of the removal of the exposed portions of the amorphous dielectric layer 30B. This can be accomplished by RIE or by the use of a wet chemical etch selective to the material of the dielectric layer 30.

FIG. 1I shows a result of the selective removal of the spacer 28 to form recessed spacer portions 28A. Any suitable removal process can be applied. Note that it may be preferred that the material of the spacer 26 differs from the material of the spacer 28, and that the removal process is selective to the material of the spacer 28 in order to leave the spacer 26 substantially intact.

Figure 1J:
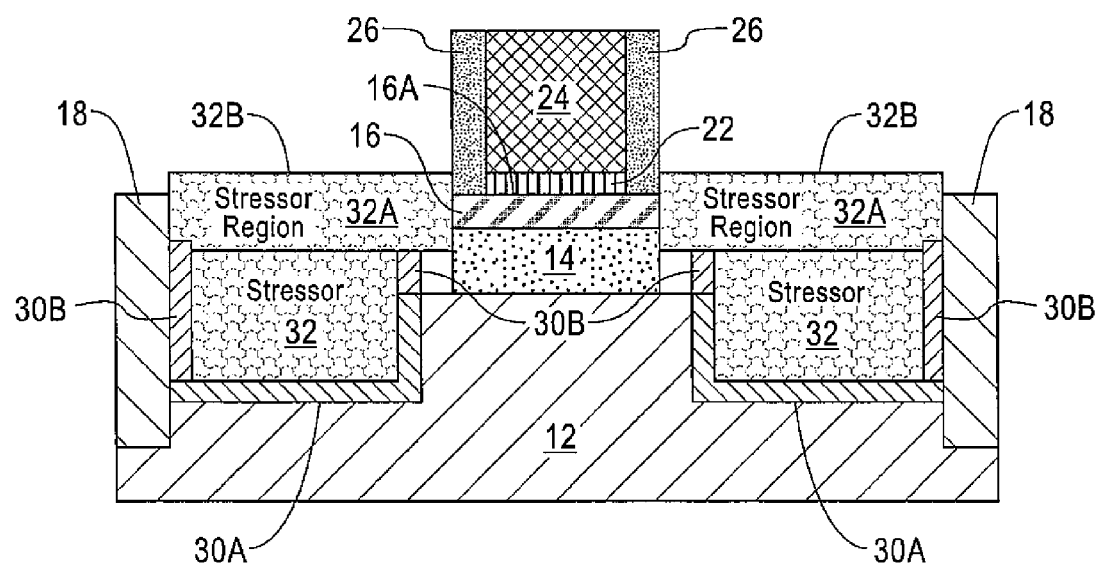

FIG. 1J shows a result of a continued epitaxial growth of the crystalline semiconductor layer of the stressor 32 to form stressor regions 32A that are contiguous with the underlying stressors 32. The same material can be used for the stressor regions 32A that was used for the stressors 32. The stressor regions 32A can be in situ doped or they can be undoped. If doped they can have the same dopant concentration as the underlying stressors 32 or a different dopant concentration. The stressor regions 32A are grown to a height such that a top surface 32B thereof is about coplanar with the top surface 16A of the SOI 16 beneath the gate stack 20 (or higher, such as to a height about equal to the top surface of the gate dielectric 22 as shown in FIG. 1J).

Processing of the FET can then continue in a conventional fashion to form S/Ds, such as a raised source drain (RSD), over the stressor regions 32A, to deposit an interlayer dielectric (ILD), to form contacts to the gate metal 24 and the S/Ds and to form any contact or contacts if desired to a backgate (if present) in the substrate 12.

FIGS. 2A-2G illustrate in enlarged cross-section (not to scale) a second embodiment of this invention to provide an epitaxial dielectric material to isolate a stressor from a substrate.

Figure 2A:
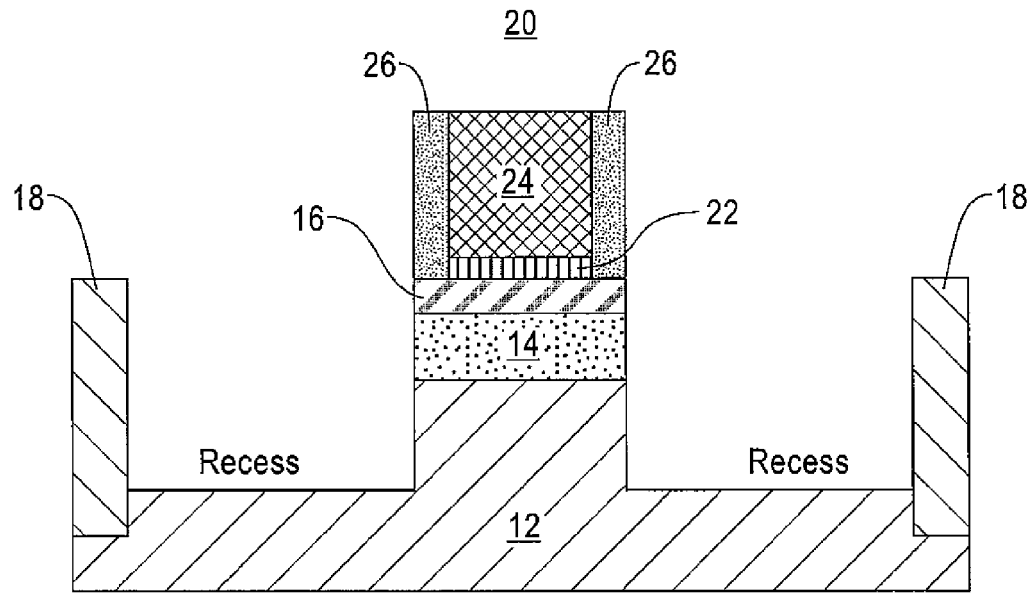
FIGS. 2A-2G, collectively referred to as FIG. 2, illustrate a second embodiment of this invention to provide an epitaxial dielectric material to isolate a stressor from a substrate.

FIG. 2A shows a result of processing of the wafer 10 to a point where the gate stack 20 is present and the recess has been formed in the substrate 10.

Figure 2B:
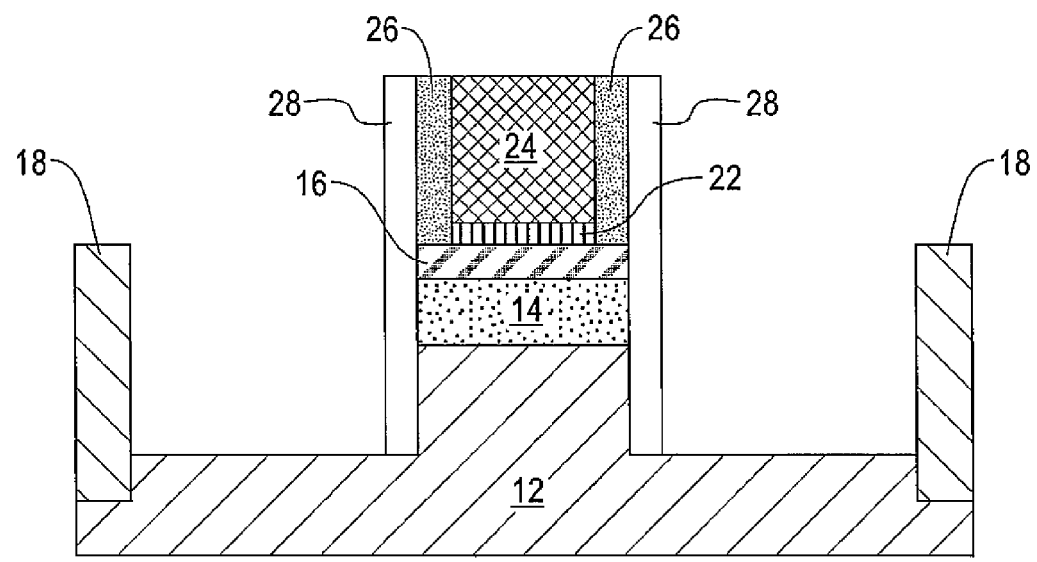

FIG. 2B shows the result of the formation of the second spacer 28 to protect the sidewalls of the channel during subsequent processing. Note in this case, as contrasted with FIGS. 1D and 1E, the second spacer 28 extends also over the recessed portion of the substrate to the bottom of the recess.

Figure 2C:
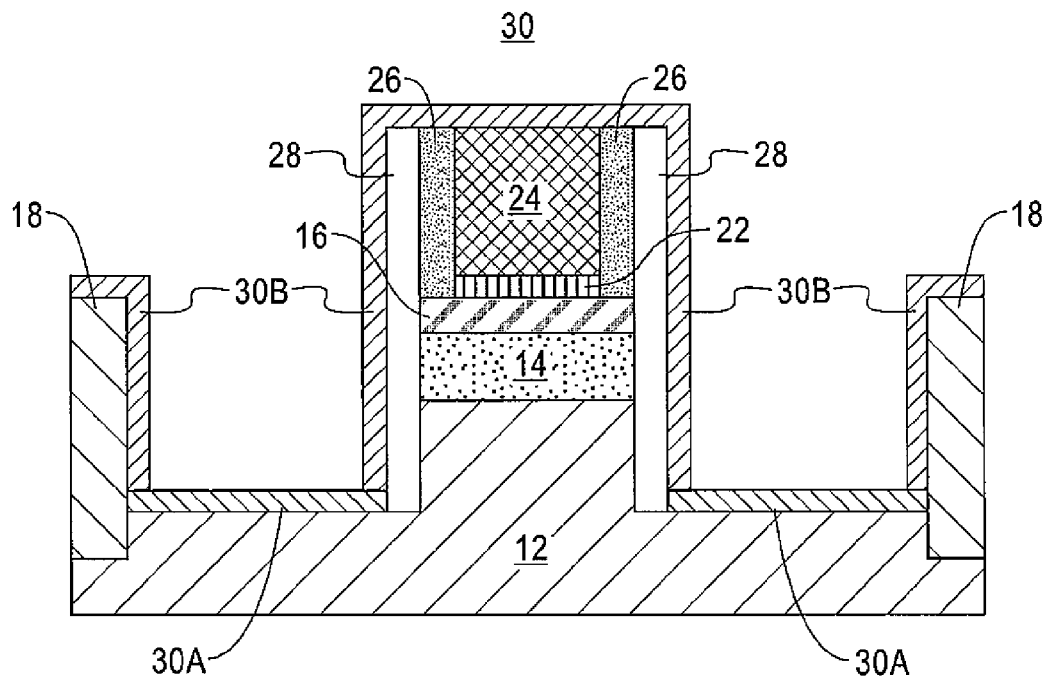
Figure 2D:
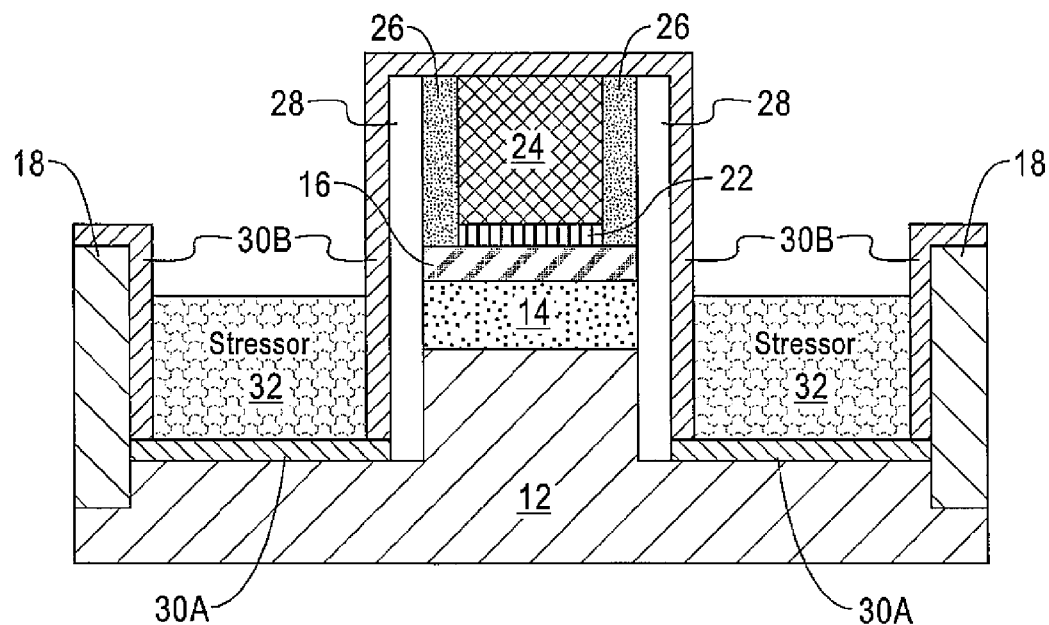
Figure 2E:
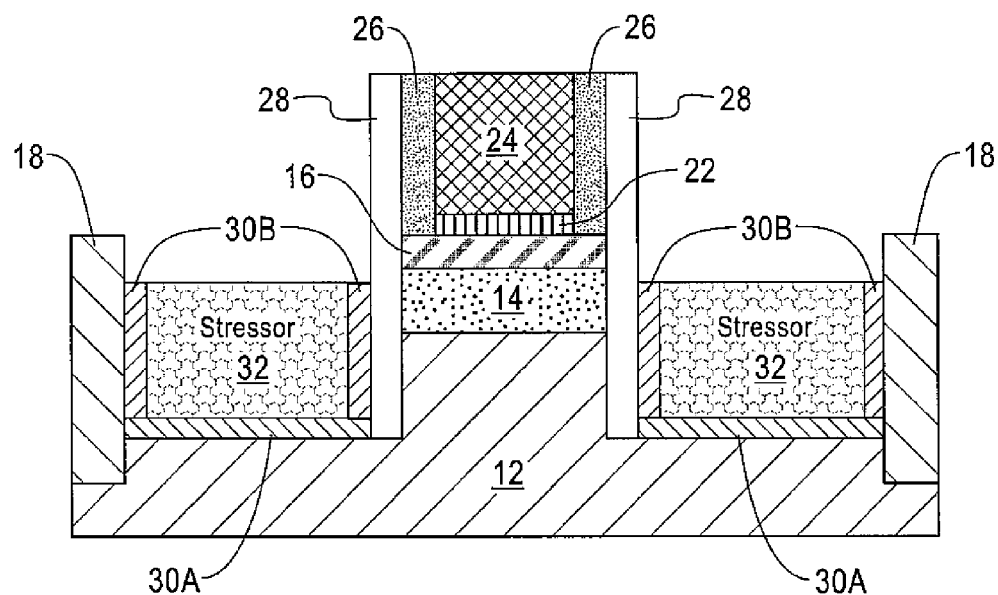
Figure 2F:
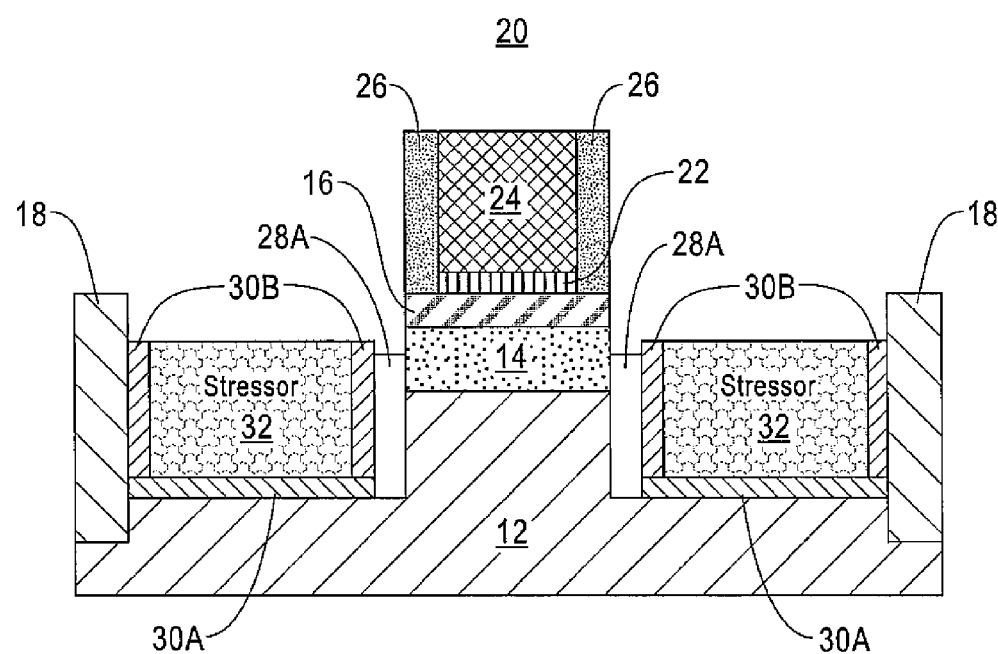

FIG. 2C shows a result of the growth of the dielectric layer 30. Note in this embodiment, due to the presence of the spacer 28 on the sidewall portion of the substrate recess beneath the gate stack 20, that the crystalline (epitaxial) layer 30A is present only on the surface of the substrate 12 at the bottom of the recess, while in all of the other locations the dielectric layer 30 has the form of the amorphous dielectric layer 30B.

The use of this embodiment can be beneficial during the bottom-up growth of the dielectric layer 30 in that there is a reduced risk of a defect to be introduced into the crystalline (epitaxial) layer 30A, as could possibly occur along the vertical sidewalls of the substrate 12 during the dielectric deposition.

Figure 2G:
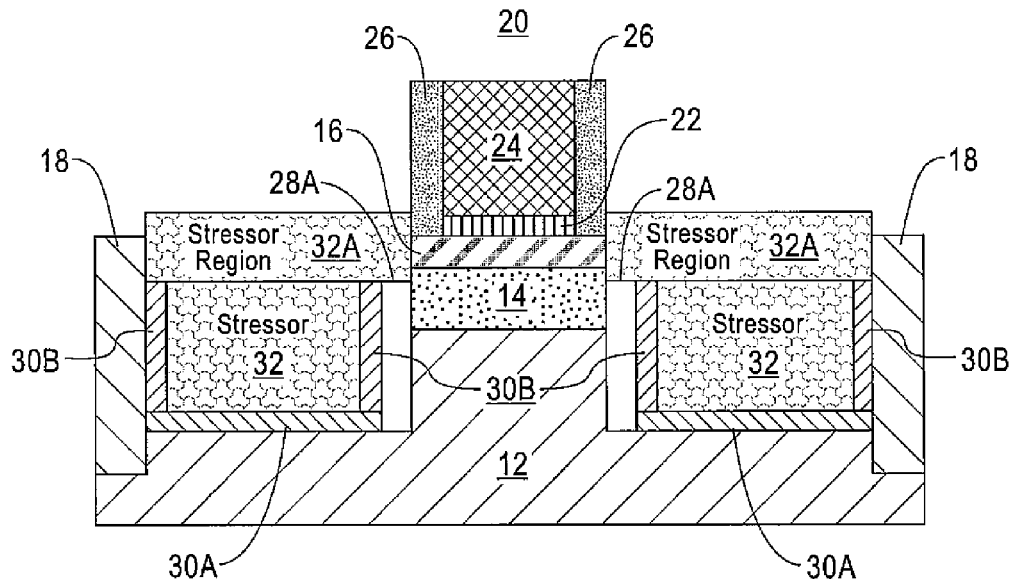

FIGS. 2D-2G are basically similar or identical to the process steps of FIGS. 1G-1J explained above, i.e., growing the doped or undoped stressor 32 over the dielectric layer 30 in the substrate recess (FIG. 2D); removal of the exposed portions of the amorphous dielectric layer 30B (FIG. 2E); the removal of exposed portions of the second spacer 28 and the recessing of same to form recessed portions 28A (FIG. 2F); and the continued epitaxial growth of the crystalline semiconductor layer of the stressor 32 to form stressor regions 32A (FIG. 2G).

FIGS. 3A-3G illustrate in enlarged cross-section (not to scale) a third exemplary embodiment of this invention to provide an epitaxial dielectric material to isolate a stressor from a substrate.

Figure 3A:
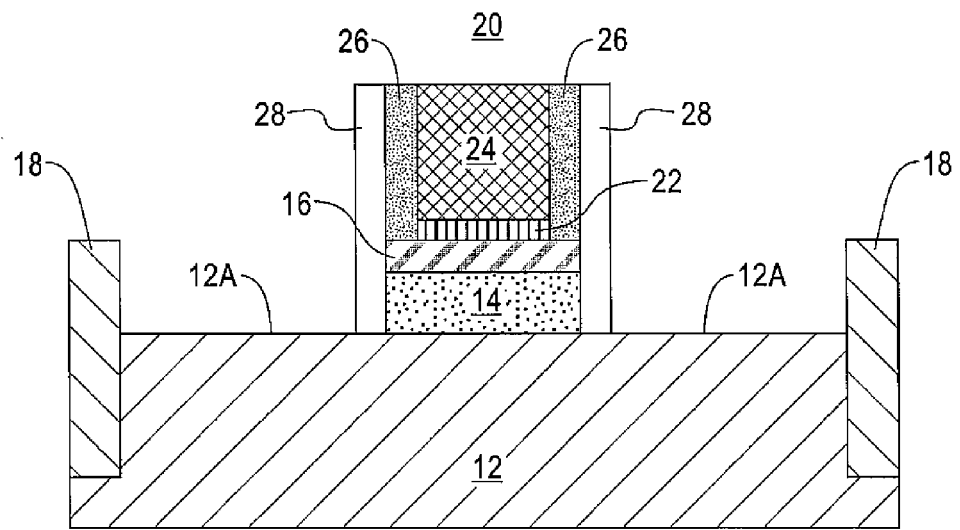
FIGS. 3A-3G, collectively referred to as FIG. 3, illustrate a still further embodiment of this invention to provide an epitaxial dielectric material to isolate a stressor from a substrate.

FIG. 3A shows a result of processing of the wafer 10 to a point as in FIG. 1D where the gate stack 20 is present, the SOI layer 16 and the BOX 14 have been removed to expose the surface 12A of the substrate 12, and the second spacer 28 has been formed to protect the sidewalls of the channel during subsequent processing.

Figure 3B:
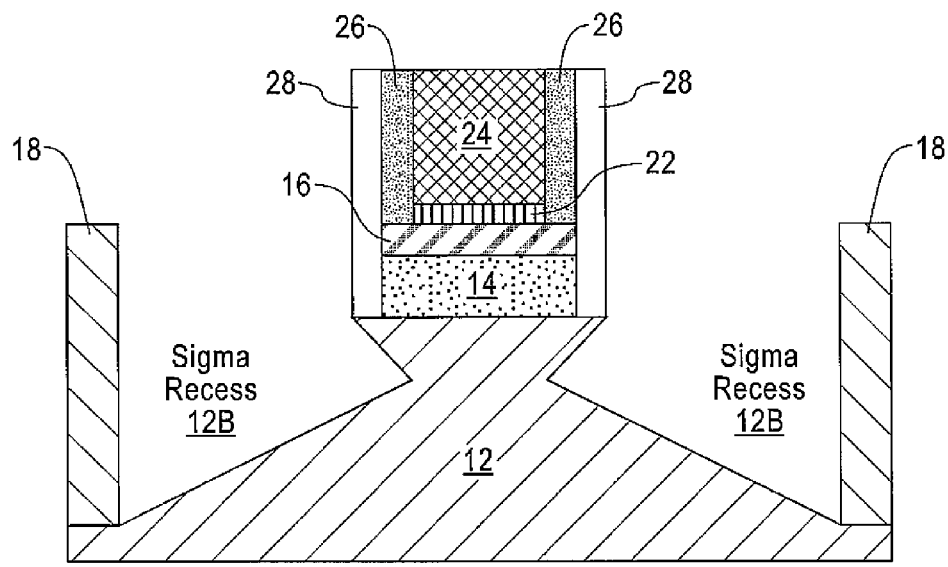

FIG. 3B shows a result of an anisotropic etch that serves to remove more of the substrate 12 volume than the embodiments of FIGS. 1 and 2 thereby enabling the resulting deposited stressor 32 to have a larger volume directed towards the channel and to thus apply proportionally more strain to the Si channel. If one assumes for convenience a <100> crystalline orientation of the substrate 100 then the anisotropic etch stops at the <111> plane. The resulting "sigma" substrate recess 12B can be seen to partially undercut the overlying gate structure 20 and second spacer 28. This etching profile can be achieved by first etching partially downwards into the substrate 12 to form a substantially rectangular box shaped recess (e.g., as in FIGS. 1E and 2A) and then performing, as a non-limiting example, a chemical etch using Tetramethylammonium hydroxide (TMAH). Note that the etched recess will typically not extend to the bottom of the trench isolation 18 as shown.

Thus, in some embodiments of this invention the recess can exhibit substantially vertical sidewall surfaces and an exposed surface of the substrate 12 upon which the crystalline dielectric material 30A is formed is present at least along a bottom surface of the recess, where the bottom surface is substantially perpendicular to the vertical sidewall surfaces. In an embodiment of this invention where the recess is formed using an anisotropic etch process in the crystalline semiconductor substrate 12 the recess comprises at least one sidewall that extends at an angle upwardly towards and at least partially beneath the channel region, and where the exposed surface of the substrate 12 upon which the crystalline dielectric material 30A is formed is present at least along the at least one upwardly angled sidewall.

Figure 3C:
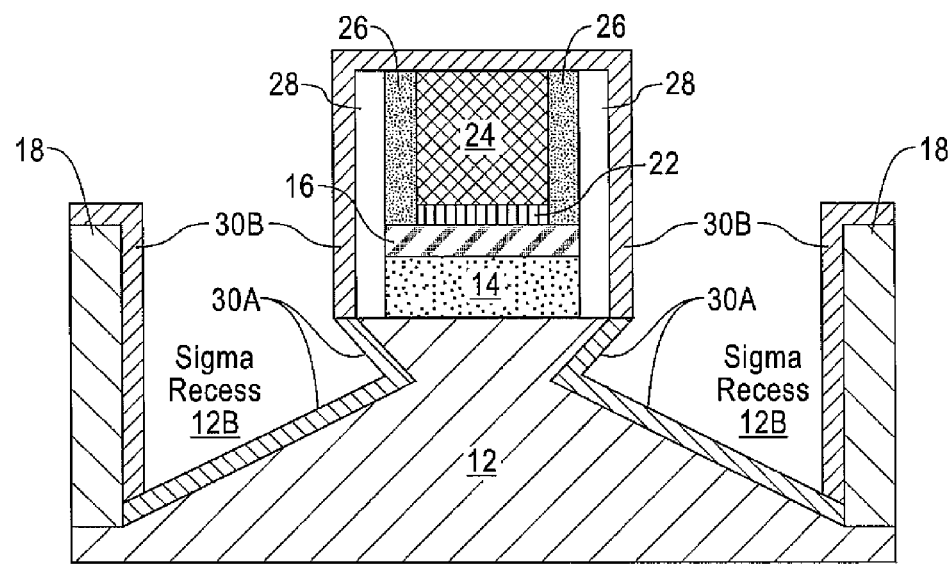
Figure 3D:
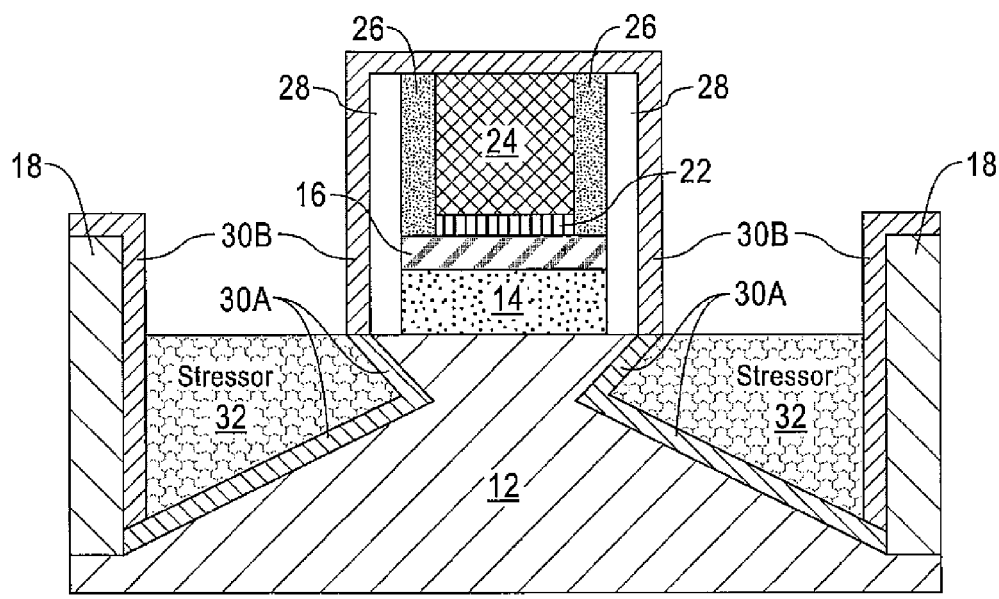
Figure 3E:
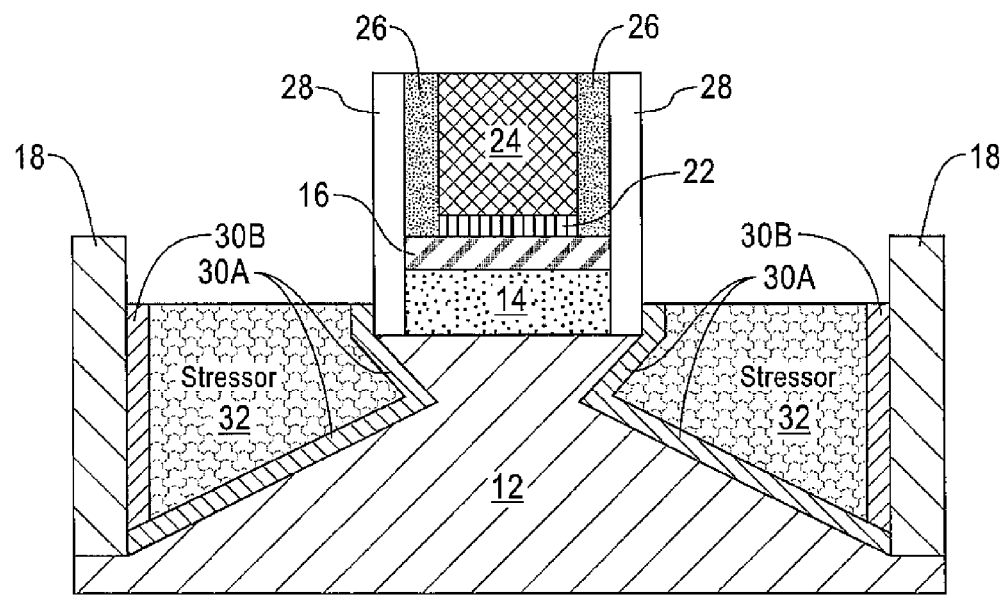
Figure 3F:
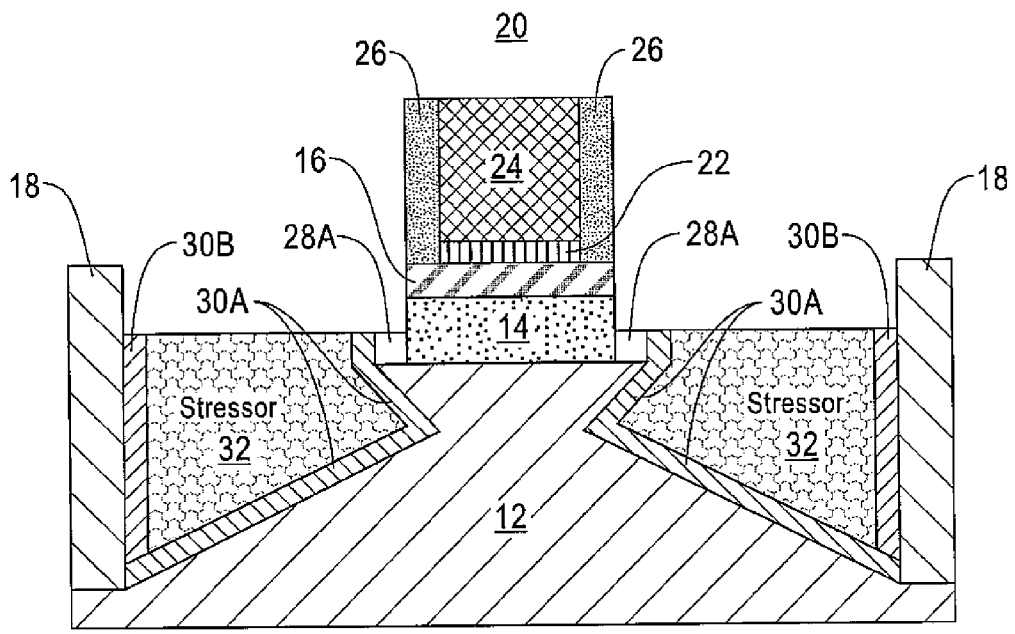

FIG. 3C shows a result of the growth of the dielectric layer 30. Note in this embodiment, due to the larger exposed surface area of the crystalline substrate 12 resulting from the anisotropic etch of FIG. 3B, that there will be a corresponding larger area covered by the crystalline spacer 30A beneath the gate stack 20 and extending to the trench isolation 18. In all other locations the dielectric layer 30 has the form of the amorphous dielectric layer 30B.

Figure 3G:
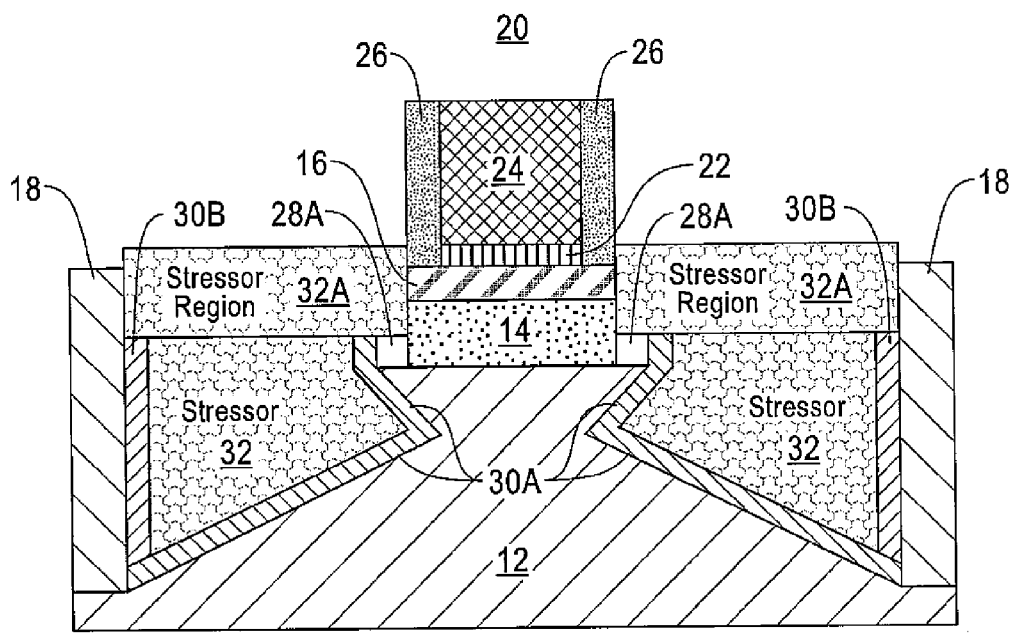

FIGS. 3D-3G are basically similar or identical to the process steps of FIGS. 1G-1J explained above, i.e., growing the doped or undoped stressor 32 over the dielectric layer 30 within the (sigma) substrate recess 12B (FIG. 3D); removal of the exposed portions of the amorphous dielectric layer 30B (FIG. 3E); the removal of exposed portions of the second spacer 28 to form recessed portions 28A (FIG. 3F); and the continued epitaxial growth of the crystalline semiconductor layer of the stressor 32 to form stressor regions 32A (FIG. 3G).

It is to be understood that the exemplary embodiments discussed above with reference to FIGS. 1-3 can be used on common variants of the FET device including, e.g., FET devices with multi-fingered FIN and/or gate structures, and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes, may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A structure, comprising:
    a transistor gate stack disposed on a semiconductor-on-insulator (SOI) layer that in turn is disposed upon a buried oxide layer disposed upon a surface of a crystalline semiconductor substrate, where a transistor channel is disposed within the SOI layer;
    a channel stressor layer disposed at least partially within a recess formed in the crystalline semiconductor substrate and disposed about the channel; and
    a layer of crystalline dielectric material disposed between the channel stressor layer and a surface of the crystalline semiconductor substrate;
    where the layer of crystalline dielectric material is an epitaxial layer disposed on an exposed portion of the surface of the crystalline semiconductor substrate only at the bottom of the recess.

2. The structure of claim 1, where the recess has substantially vertical sidewall surfaces, and where the exposed surface is at least a bottom surface of the recess that is substantially perpendicular to the vertical sidewall surfaces.

3. The structure of claim 1, where the recess comprises at least one sidewall that extends at an angle upwardly towards and at least partially beneath the transistor channel, and where the exposed surface is at least along the at least one upwardly angled sidewall.

4. The structure of claim 1, where the layer of crystalline dielectric material is comprised of a rare earth oxide or a combination of rare earth oxides.

5. The structure of claim 1, where the layer of crystalline dielectric material is comprised of a Perovskite.

6. The structure of claim 1, where the layer of crystalline dielectric material is comprised of an aluminum oxide or an aluminum oxide compound.

7. The structure of claim 1, where the channel stressor material is comprised of one of silicon, germanium, silicon germanium, carbon doped silicon, a silicon-germanium alloy and a compound semiconductor material.

8. The structure of claim 1, where an edge of the recess is spaced away from the gate stack by a width of a spacer disposed adjacent to the buried oxide layer, and where the channel stressor material substantially fills the recess and extends over the spacer to a thickness that at least covers the SOI layer.

9. The structure of claim 1, where the gate stack is comprised of a gate stack precursor structure, and where an edge of the recess is spaced away from the gate stack precursor structure by a width of a spacer disposed adjacent to the buried oxide layer, and where the channel stressor material substantially fills the recess and extends over the spacer to a thickness that at least covers the SOI layer.

10. The structure of claim 1, where the layer of crystalline dielectric material has a thickness in a range of about 2 nm to about 10 nm.

11. The structure of claim 1, where the layer of crystalline dielectric material has a thickness of about 5 nm.

12. A structure, comprising:
a transistor gate stack disposed on a semiconductor-on-insulator (SOI) layer that in turn is disposed upon a buried oxide layer disposed upon a surface of a crystalline semiconductor substrate, where a transistor channel is disposed within the SOI layer;
a channel stressor layer disposed at least partially within a recess formed in the crystalline semiconductor substrate and disposed about the channel; and
a layer of crystalline dielectric material disposed between the channel stressor layer and a surface of the crystalline semiconductor substrate;
where sidewalls of the gate stack are surrounded with a spacer layer having an inner surface and a second opposite surface, where the recess has a first surface that is a substantially vertical sidewall surface, a second surface that extends from a bottom edge of the first surface at an angle upwardly towards to a first point beneath the transistor channel, and a third surface that extends from the first point at an angle upwardly to a second point beneath the second surface of the spacer layer.

13. The structure of claim 12, where the layer of crystalline dielectric material is disposed upon at least the second surface of the recess.

\* \* \* \* \*